(12) United States Patent
Okane et al.

(10) Patent No.: US 7,569,921 B2
(45) Date of Patent: Aug. 4, 2009

(54) SEMICONDUCTOR DEVICE AND MANUFACTURING METHOD THEREOF

(75) Inventors: Noboru Okane, Yokkaichi (JP); Ryoji Matsushima, Yokkaichi (JP); Kazuhiro Yamamori, Yokkaichi (JP); Junya Sagara, Kawasaki (JP); Yoshio Iizuka, Yokohama (JP); Kuniyuki Ohnishi, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 87 days.

(21) Appl. No.: 11/398,694

(22) Filed: Apr. 6, 2006

(65) Prior Publication Data

US 2006/0232288 A1    Oct. 19, 2006

(30) Foreign Application Priority Data

Apr. 8, 2005    (JP) .............................. 2005-112142

(51) Int. Cl.
*H01L 23/02*    (2006.01)
(52) U.S. Cl. ........................ 257/686; 257/782; 257/777; 257/784; 438/109; 438/118
(58) Field of Classification Search ................. 257/686, 257/777, 784, 783, 782; 438/107, 109, 118
See application file for complete search history.

(56) References Cited

U.S. PATENT DOCUMENTS

| | | | | |
|---|---|---|---|---|
| 6,710,455 | B2 * | 3/2004 | Goller et al. | 257/777 |
| 6,977,439 | B2 * | 12/2005 | Kang et al. | 257/777 |
| 7,030,489 | B2 * | 4/2006 | Kang et al. | 257/723 |
| 2003/0047813 | A1 * | 3/2003 | Goller et al. | 257/777 |
| 2004/0104477 | A1 | 6/2004 | Fujisawa | |
| 2004/0222509 | A1 * | 11/2004 | Ogata | 257/686 |

FOREIGN PATENT DOCUMENTS

JP    9-51011    2/1997

* cited by examiner

*Primary Examiner*—S. V Clark
(74) *Attorney, Agent, or Firm*—Oblon, Spivak, McClelland, Maier & Neustadt, P.C.

(57) ABSTRACT

A semiconductor device has a plurality of bare chips stacked on at least one of first and second main surfaces oppositely arranged on a support substrate, spacers arranged between two bare chips arranged adjacently in up and down direction among the plurality of bare chips, and inner leads which are arranged at both sides in a horizontal direction of the support substrate and are connected to pads of the bare chips via bonding wires, wherein the bonding wires which connect the pads of the bare chips at one end side of the spacers to the corresponding inner leads, are arranged not to contact the bare chip at the other end side of the same spacer.

19 Claims, 8 Drawing Sheets

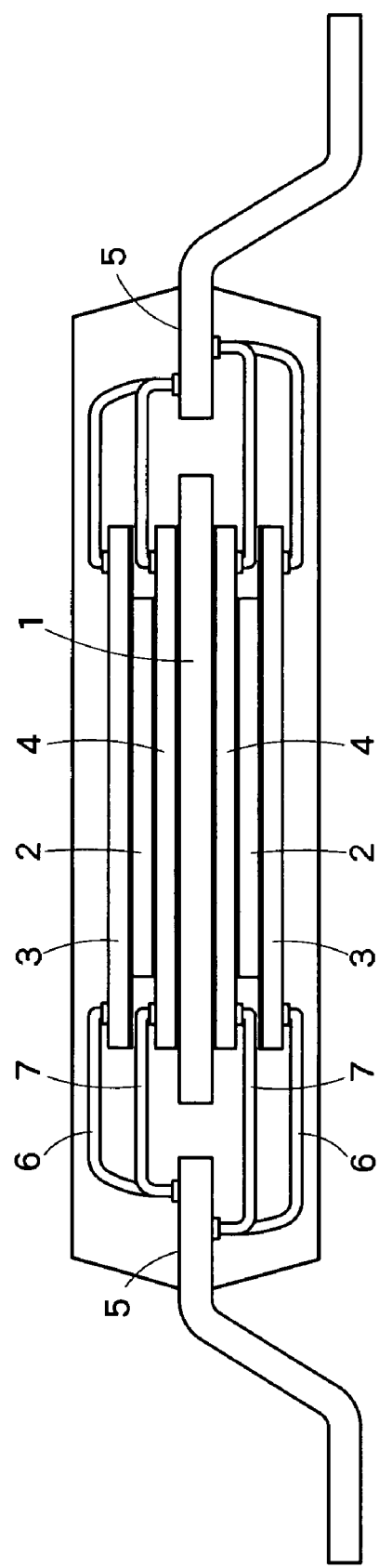
F I G. 1

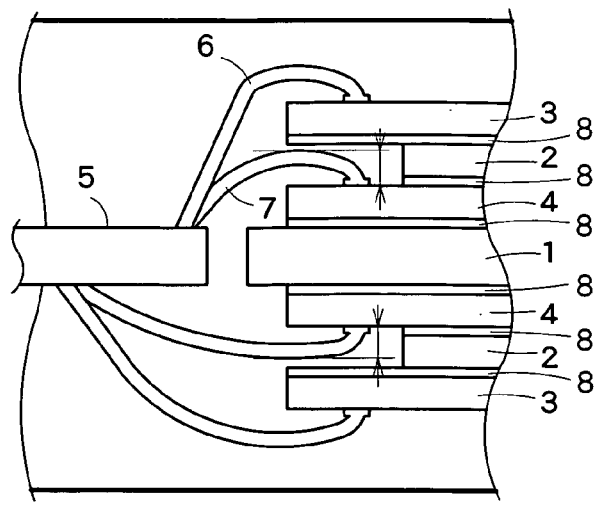
F I G. 2
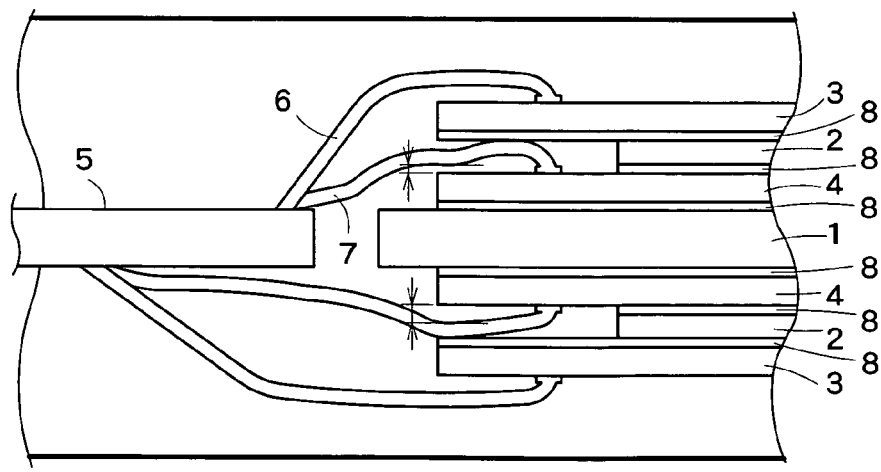
F I G. 3
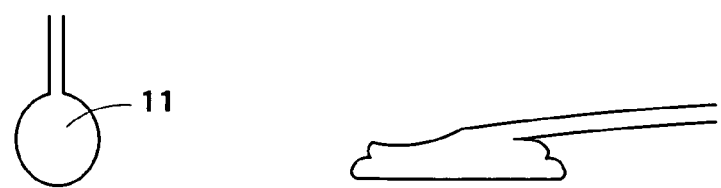
F I G. 4A    F I G. 4B

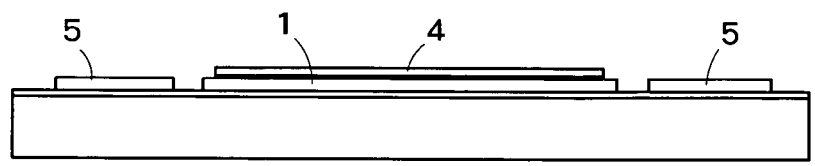
F I G. 5A
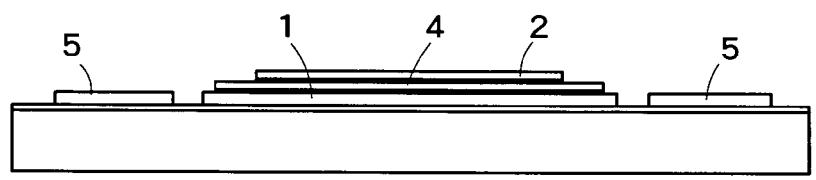
F I G. 5B
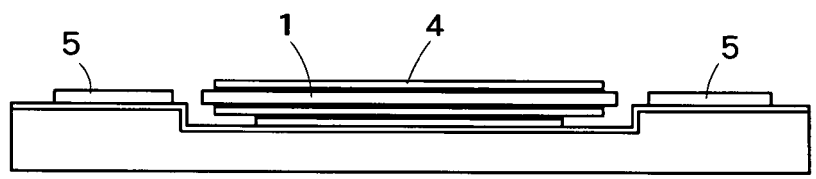
F I G. 5C
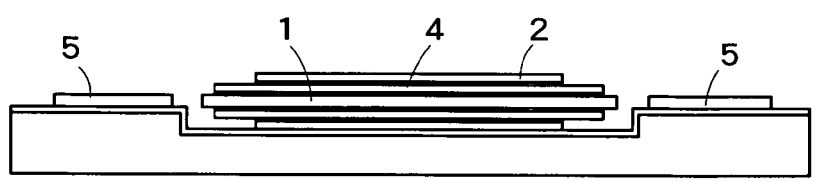
F I G. 5D
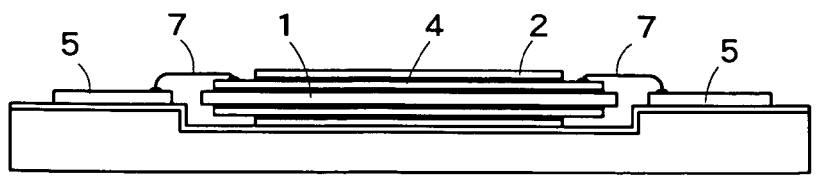
F I G. 5E

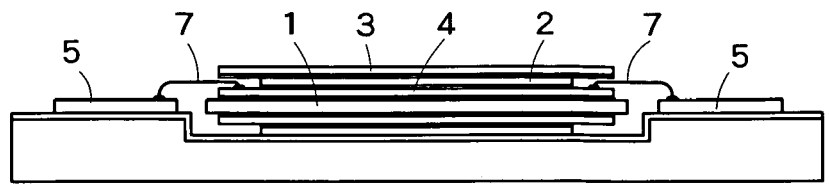
F I G. 6A
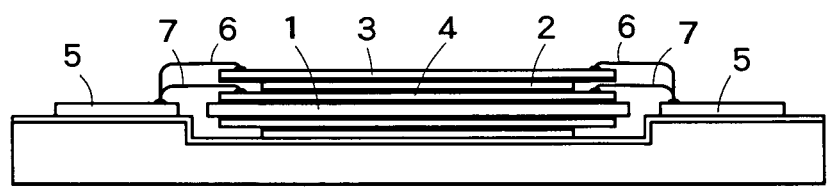
F I G. 6B
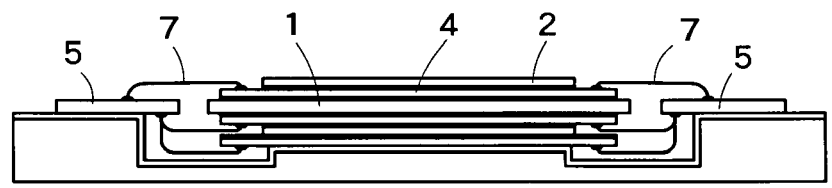
F I G. 6C
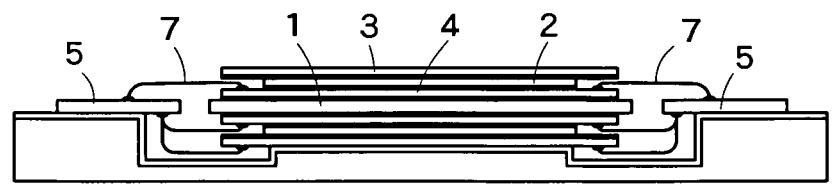
F I G. 6D
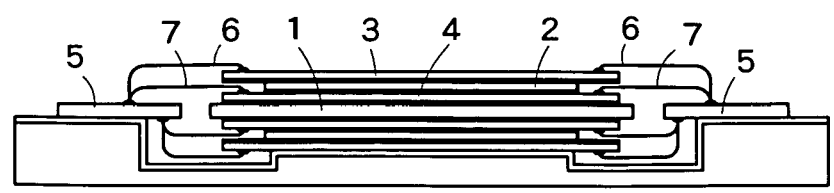
F I G. 6E

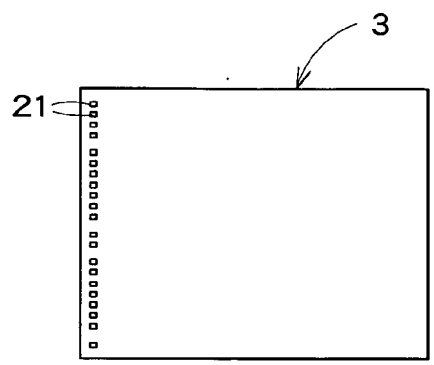
F I G. 11
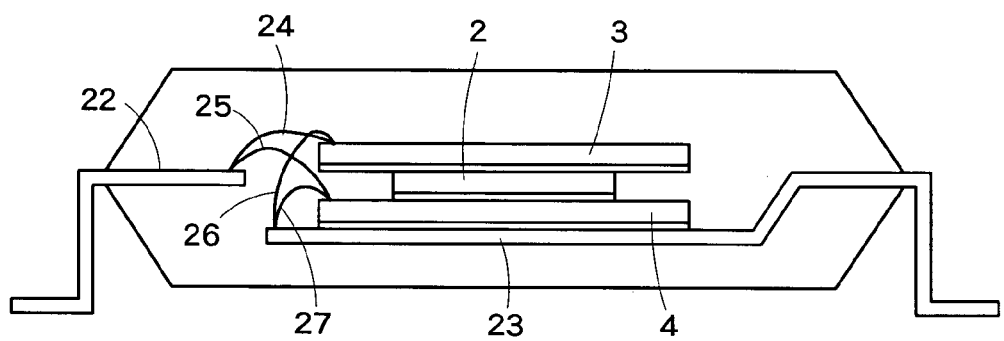
F I G. 12
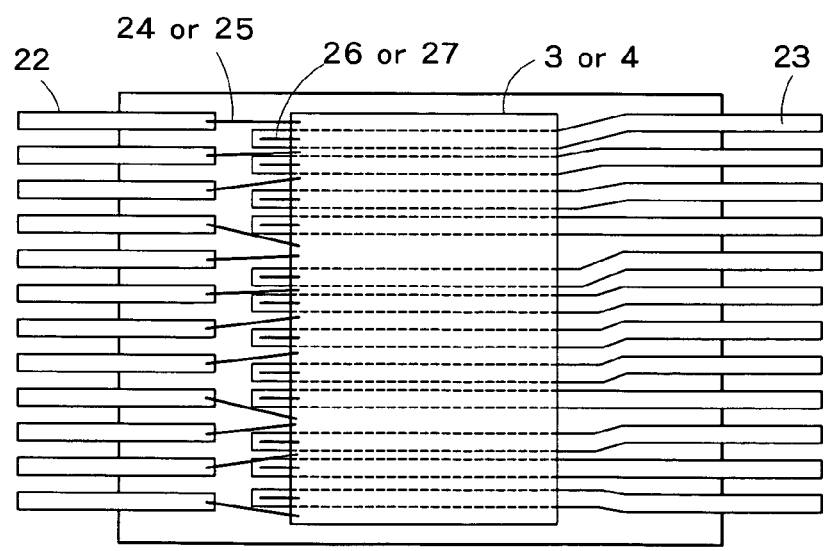
F I G. 13

US 7,569,921 B2

SEMICONDUCTOR DEVICE AND MANUFACTURING METHOD THEREOF

CROSS REFERENCE TO RELATED APPLICATIONS

This application is based upon and claims the benefit of priority from the prior Japanese Patent Application No. 2005-112142, filed on Apr. 8, 2005, the entire contents of which are incorporated herein by reference.

BACKGROUND OF THE INVENTION

1. Field of the Invention

The present invention relates to a semiconductor device with bare chips mounted on a support substrate.

2. Related Art

A flash memory is widely used as a storage device of various kinds of electronics because it is freely rewritable and can hold data without a supply voltage. Since the flash memory can read/reproduce data without mechanical parts such as an optical pickup or a magnetic head, the sizes of the electronics can be smaller, and electrical power consumption can also be reduced. Further, since the flash memory has no mechanical parts, product durability can be improved, and cost reduction can also be achieved. In view of such a background, the flash memory is expected to be more and widely used as a replacement of a large capacity storage device such as a MD or a HDD.

However, since the flash memory is limited by the wiring rule width, its storage capacity cannot be increased rapidly. Accordingly, there is an approach for housing a plurality of flash memory chips formed on a wafer (hereinafter simply referred to as chips) in one package to increase the storage capacity.

It is not desirable to laterally align the chips for packaging, because overall size of the package becomes larger. In order to reduce overall size of the package, for example, it is considered that the chips are arranged on both sizes of a support substrate. The pads of the chips are connected to inner leads via bonding wires. However, since the bonding wires trace an arc, the chips need a height for the bonding wires. Especially, when the chips are arranged on both sides of the support substrate, the bonding wires have to also be arranged on the both sides of the chips. Therefore, it will be difficult to satisfy the limitation in the height direction.

An approach for lowering the height of the bonding wire is known (See; Japanese Patent Laid-Open No. 09-51011). However, even if a technology such as Japanese Patent Laid-Open No. 09-51011 is used to mount chips on both sides of a support substrate, at most two chips can be built in one package, thereby, it is not possible to significantly increase the storage capacity.

SUMMARY OF THE INVENTION

According to one embodiment of the present invention, a semiconductor device, comprising:

a plurality of bare chips stacked on at least one of first and second main surfaces oppositely arranged on a support substrate;

spacers arranged between two bare chips arranged adjacently in up and down direction among the plurality of bare chips; and inner leads which are arranged at both sides in a horizontal direction of the support substrate and are connected to pads of the bare chips via bonding wires, wherein the bonding wires which connect the pads of the bare chips at one end side of the spacers to the corresponding inner leads, are arranged not to contact the bare chip at the other end side of the same spacer.

Furthermore, according to one embodiment of the present invention, a semiconductor device, comprising:

first inner leads;

second inner leads which are arranged separately from the first inner leads in a horizontal direction and have lead parts longer than those of the first inner leads;

a plurality of bare chips which are stacked across a spacer on the second inner leads and have pads formed along one side; and a plurality of bonding wires which connect the first inner leads to pads of the plurality of bare chips and the second inner leads to pads of the plurality of bare chips, wherein the bonding wires which connect the pads of the bare chips at one end side of the spacers to the corresponding first or second inner leads are arranged not to contact the bare chip at the other end side of the same spacer.

Furthermore, according to one embodiment of the present invention, a method of manufacturing a semiconductor device, comprising:

mounting a first bare chip on a first main surface of a support substrate via a binding material;

attaching a first spacer on a surface of the first bare chip via the binding material;

connecting the pads of the first bare chip and inner leads by bonding wires and arranging the bonding wires so that a maximum height of the bonding wires become lower than a top end of the first spacers;

attaching a second bare chip on a surface of the first spacer via the binding material;

connecting pads of the second bare chip and the inner leads by the bonding wires;

attaching a third bare chip on a second main surface of the support substrate via the binding material in parallel to one of the processings of mounting the first bare chip, attaching the first spacer, connecting the pads, attaching the second bare chip and connecting the pads, or after the all the processings are finished;

attaching a third spacer on a surface of the third bare chip via the binding material;

connecting pads of the third bare chip and the inner leads by the bonding wires and arranging the bonding wires so that a maximum height of the bonding wires become lower than a top end of the third spacer;

attaching a four bare chip on a surface of the third spacer via the binding material; and connecting pads of the four bare chip and the inner leads by the bonding wires.

BRIEF DESCRIPTION OF THE DRAWINGS

FIG. 1 is a view showing a sectional structure of a semiconductor device according to one embodiment of the present invention.

FIG. 2 is an enlarged view of a part in FIG. 1.

FIG. 3 is a comparative example of FIG. 2, and shows an example in which the bonding wire 7 contacts the bare chip 3.

FIGS. 4A and 4B are views showing the structure in vicinity of bonding areas between the bonging wires 6, 7 and the pads of the bare chip 3.

FIGS. 5A-5E are sectional views showing manufacturing steps.

FIGS. 6A-6E are sectional views showing manufacturing steps subsequent to FIGS. 5A-5E.

FIG. 11 is a plan view of the bare chip on which pads are formed only along one side.

FIG. 12 is a sectional view of the semiconductor storage device according to the second embodiment.

FIG. 13 is a plan view viewed from above in FIG. 12.

DETAILED DESCRIPTION OF THE INVENTION

Figure 7:
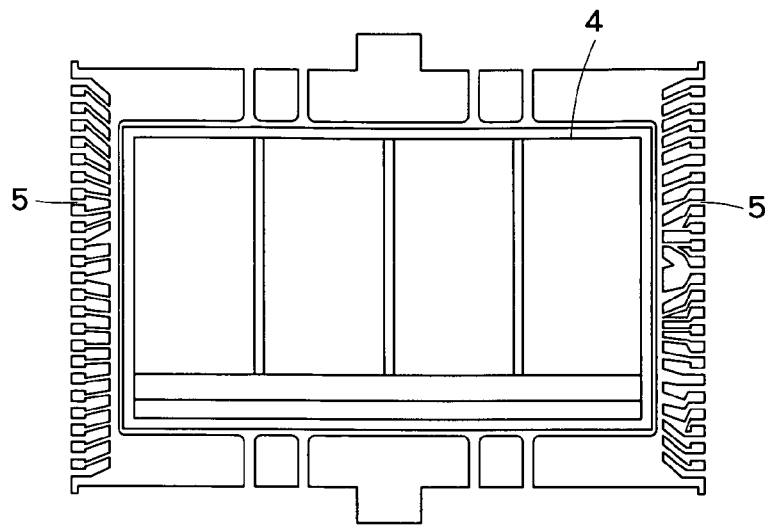
FIG. 7 is a top surface view in the step of FIG. 5A.

Now, referring to the drawings, one embodiment of the present invention will be described.

FIG. 1 is a view showing a sectional structure of a semiconductor device according to one embodiment of the present invention, and FIG. 2 is an enlarged view of a part in FIG. 1. In the semiconductor device in FIG. 1, a plurality of flash memory chips (hereinafter referred to as bare chips) and a memory controller (not shown) are built in one package. The number or the storage capacity of the bare chips built in one package is not specifically limited. For example, four chips of two giga bits (total one G byte) are built in.

As a detailed structure of the semiconductor device of FIG. 1 is shown in FIG. 2, two bare chips 3 and 4 are arranged across a silicon spacer 2 on the upper surface of a bed frame 1 (support substrate), and two bare chips 3 and 4 are also arranged across a silicon spacer 2 on the lower surface of the bed frame 1. Inner leads 5 are arranged at the both sides of the bed frame 1 in the horizontal direction, and the inner leads 5 and the pads of the bare chips 3 and 4 are connected by bonding wires 6 and 7. Since the bare chips 3 and 4 are arranged on the both surfaces of the bed frame 1, the bonding wires 6 and 7 are also arranged on the both surfaces of the bed frame 1.

Of the two bare chips 3 and 4 stacked on the upper surface side of the bed frame 1, the bare chip 3 is connected to the inner lead 5 by the bonding wire 6, and the bare chip 4 is connected to the inner lead 5 by the bonding wire 7. The same is connected even at the lower surface side of the bed frame 1.

The connection position of the bonding wire 6 on the upper surface side of the inner leads 5 is shifted from the connection position of the bonding wire 7 on the lower surface side of the inner lead 5 in the right and left direction.

Binding materials 8 are connected between the bed frame 1 and the bare chip 4, between the bare chip 4 and the silicon spacer 2, and between the bare chip 3 and the silicon spacer 2. The types of the binding material 8 are not specifically required. However, for example, a material containing a resin such as epoxy is used.

In this embodiment, as apparent from FIG. 2, the height of the bonding wire 7 for connecting the pad of the bare chip 4 on one end side of the silicon spacer 2 to the inner lead 5 is limited so that the height of the bonding wire 7 does not contact the bare chip 3 on the other end side of the same silicon spacer 2.

FIG. 3 is a comparative example of FIG. 2, and shows an example in which the bonding wire 7 contacts a backside of the bare chip 3. In the case of FIG. 3, an external stress tends to be applied to the bonding wires 6 and 7, thereby, the bonding strengths of the bonding wires 6 and 7 deteriorate, or the bending shapes of the bonding wires 6 and 7 becomes unstable. Therefore, if it is impossible to obtain enough clearance for the bonding wires 6 and 7, the bonding wire 7 may contact the backside of the bare chip 3. Since the surface of the backside of the bare chip 3 (the surface on the side of the silicon spacer 2) is attached with the binding material 8, there is little possibility that short-circuit failure occurs. However, since the surface on the bonding wire side of the bare chip 4 is exposed, when the bonding wire 7 contacts the surface, there is much possibility that short-circuit failure occurs.

On the contrary, in this embodiment, the sum of the thickness of the silicon spacer 2 and the thickness of the binding material 8 of the silicon spacer 2 is set to two-four times of diameter of the bonding wires 6 and 7 so that, even if the thickness variation of the semiconductor chip or the binding material 8 occurs, bonding wire 7 and the bare chip 3 do not contact each other.

Here, the reason for setting to two times or more is that the bonding wires 6 and 7 are folded back at least once above the pads of the bare chips 3 and 4. The bonding wires 6 and 7 are folded back at least once above the pads of the bare chips 3 and 4, and extended in a horizontal direction toward the inner lead 5 from the folded places. Therefore, if the bonding wires 6 and 7 are folded back once without any clearance, the height of the bonding wires 6 and 7 will be two times order of the diameter of the bonding wires 6 and 7. Moreover, the reason for setting to four times or less is that, when the bonding wires 6 and 7 are folded back above the pads of the bare chips 3 and 4, some clearance can be obtained at the folded places.

FIG. 4 is a view showing the structure in vicinity of bonding areas between the bonging wires 6, 7 and the pads of the bare chip 3. As shown in FIG. 4A, balls 11 are formed on the tips of the bonding wires 6 and 7, and these balls 11 are pressure bonded on the pads. At that time, as shown in FIG. 4B, not only the balls 11, parts of the bonding wires 6 and 7 are folded back to be pressure bonded to the pads.

In this embodiment, a silicon spacer 2 is used as a spacer 2 between the bare chips 3 and 4. The reason of using the silicon spacer 2 is that the silicon spacer 2 excels in heat resistance. In this embodiment, the bondability of the bonding wires 6 and 7 can be improved by raising the temperature during production. If a silicon spacer 2 formed with a resin such as polyimide (PI) is used, it is impossible to raise the temperature so much. Therefore, the bondability of the bonding wires 6 and 7 deteriorates, thereby complicating the process and raising the production cost.

FIGS. 5 and 6 are sectional views showing the manufacturing steps of the semiconductor device according to the present embodiment. First, a sheet of the binding material 8 is attached on an entire backside of a wafer on which flash memories are formed, and then the sheet is cut along a rim of the wafer. In this manner, the binding material 8 is attached on the whole surface of the backside of the wafer. Next, the wafer is diced to separate each bare chip 3.

Next, first bare chips 4 are attached on a bed frame 1 after the surface attached with the binding material 8 is set to face down (FIG. 5A). The top view of this case is shown in FIG. 7.

Next, first silicon spacer 2 is attached on the top surface of the first bare chips 4 via the binding material 8 (FIG. 5B). Next, the bed frame 1 is turned upside down, and second bare chips 4 are attached on the bed frame 1 after the surface with the binding material 8 is set to face down (FIG. 5C). Next, second silicon spacer 2 is attached on the top surface of the second bare chips 4 via the binding material 8 (FIG. 5D).

Next, pads on the second bare chips 4 and the inner leads 5 are connected by bonding wires 7 (FIG. 5E). At this time, as shown in FIG. 2, the sum of the thickness of the second silicon spacer 2 and the thickness of the underlying binding material 8 is set to two-four times of the diameter of the bonding wire 7, so that bonding wires 7 do not contact third bare chips 3 formed at the next step.

Next, the third bare chips 3 are attached on the top surface of the second silicon spacer 2 after the surface with the binding material 8 is set to face down (FIG. 6A). Next, pads on the third bare chips 3 and the inner leads 5 are connected by bonding wires 6 (FIG. 6B).

Figure 8:
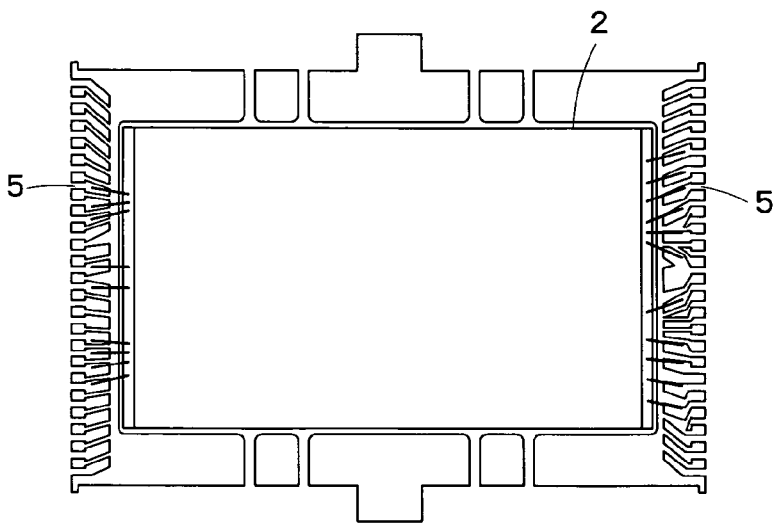
FIG. 8 is a top surface view in the step of FIG. 6C.

Next, the bed frame 1 is turned upside down, and the pads on the first bare chips 4 and the inner leads 5 are connected by bonding wires 7 (FIG. 6C). The top view of this case becomes as in FIG. 8. Even in this case, the sum of the thickness of the second silicon spacer 2 and the thickness of the underlying binding material 8 is also set to two-four times of the diameter of the bonding wire 7, so that bonding wires 7 are arranged at such a height that they do not contact fourth bare chips 3 formed at the next step.

Figure 9:
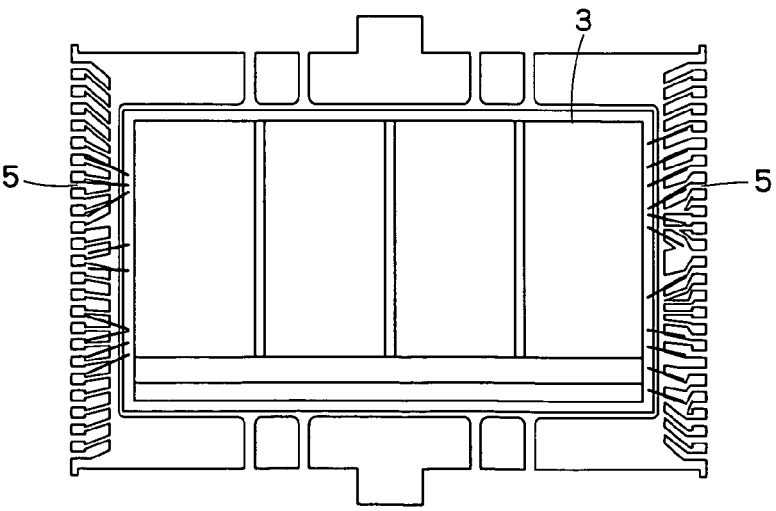
FIG. 9 is a top surface view in the step of FIG. 6E.

Next, the fourth bare chips 3 are attached on the top surface of the first silicon spacer 2 after the surface with the binding material 8 is set to face down (FIG. 6D). Next, pads on the fourth bare chips 3 and the inner leads 5 are connected by bonding wires 6 (FIG. 6E). The top view in this case is shown in FIG. 9.

By the above mentioned steps, the lamination and the wire bonding of the bare chips 3 and 4 are completed, and next, the entire body is molded to form a semiconductor package.

The orders of the manufacturing steps in FIGS. 5 and 6 are arbitrarily changeable. For example, after the attachment and wire bonding of bare chips to be stacked on the one surface of the bed frame 1 are completed, the attachment and wire bonding of bare chips on the other surface may be performed.

In the manufacturing steps in FIGS. 5 and 6, an example in which the sheet of the binding material 8 is attached on the entire wafer and then the bare chip is cut out, has been described. However, the wafer may be cut out into bare chips 3 without being attached with the binding material 8. The binding material 8 may be individually attached to the respective bare chips 3 when they are stacked. When the sheet of the binding material 8 is attached on the entire wafer surface and then the sheet is cut out along the rim of the wafer, the sheet of the binding material 8 is cut out in units of each wafer. In this case, since the unit of the sheet to be cut out is large, a large space of the sheet not used for the cut-out occurs between the spaces cut out by each wafer. On the other hand, if the binding material 8 is individually attached to the respective bare chips 3, the unit of the sheet to be cut out becomes smaller. Therefore, the space of the sheet not used for the cut-out becomes smaller, thereby enabling to use the sheet of the binding material 8 without loss.

Figure 10:
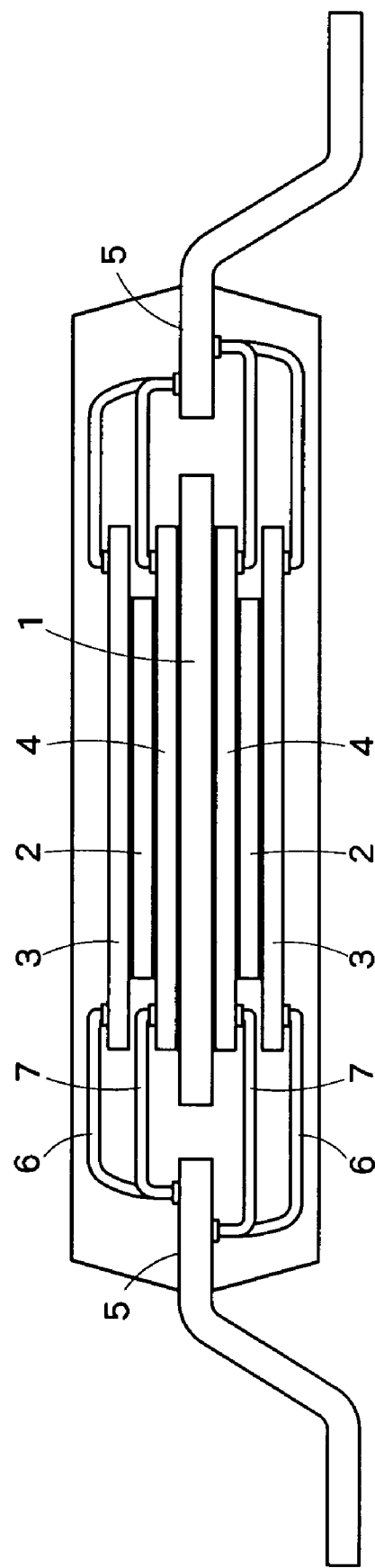
FIG. 10 is a view showing sectional structure in an example modifying FIG. 1.

In this case, the sectional structure in a completed form is shown in FIG. 10. In the semiconductor storage device of FIG. 10, the binding material 8 is attached to only a place which contacts the spacer 2 on the surface at the spacer side of the bare chip 3 attached on the upper surface of the spacer 2. Accordingly, as in this embodiment, it is an indispensable requirement for preventing the short-circuiting that the bonding wires 7 do not contact the bare chip 3.

In this manner, in the first embodiment, since when a plurality of bare chips 3 are stacked on the both surfaces of the bed frame 1, respectively, the heights of the bonding wires 7 are limited so that the bonding wires 7 for connecting the pads on the bare chips 3 to the inner leads 5 do not contact the bare chips 3. Therefore, there is no possibility that the bonding wires 7 and the bare chips 3 are electrically short-circuited to each other, and while increasing the number of the bare chips capable of building in the one package, credibility of the products can be improved.

Second Embodiment

In the above mentioned first embodiment, an example in which the pads are arranged along two opposite sides of the bare chip 3, has been described. The bare chip 3 in which the pads 1 are arranged only along one side exists. The present invention is applicable to such a bare chip 3.

FIG. 12 is a sectional view of the semiconductor storage device according to the second embodiment. The semiconductor storage device in FIG. 12 includes first inner leads 22, second inner leads 23 which are arranged substantially in parallel with the first inner leads 22 and have longer lead parts than those of the first inner leads 22, and a plurality of bare chips 3 and 4 which are stacked across a spacer 2 on the second inner leads 23 and have pads formed along one sides of themselves.

Bonding wires 24 and 25 are connected between the first inner leads 22 and the plurality of bare chips 3 and 4, and bonding wires 26 and 27 are connected between the second inner leads 23 and the plurality of bare chips 3 and 4. The bonding wires 25 and 27 for connecting the pad of the bare chip 4 on the lower end side of the spacer 2 to first or second inner leads 23 are arranged so as not to contact the bare chips 3 at the top side of the spacer 2. As in the first embodiment, the sum of the thickness of the spacer 2 and the thickness of the underlying binding material 8 is set to two-four times of the diameter of the bonding wires 25 and 27.

FIG. 13 is a plan view of FIG. 12 viewed from above. As shown in the figure, the plurality of stacked bare chips 3 are supported by the second inner leads 23 extending in the right and left directions, and the bonding wires 24-27 are connected between the bare chips 3 and the first inner leads 22, and between the bare chips 3 and the second inner leads 23.

When semiconductor chips having pads formed on their one sides are used, inner leads nearer to the pads and inner leads far from the pads groups occur, thereby, when the inner leads at the side far from the pads and the pads are connected by bonding wires, the bonding wires becomes much longer. In consequence, the wires are caused to be easily flown by resin at the following resin sealing step, and neighboring wires are caused to be easily short-circuited. However, in the second embodiment, tips of the shorter first inner leads 22 are arranged opposite to the pads of the bare chips 3 and 4. Further, the longer second inner leads 23 pass over bottom surfaces of the bare chips 3 and 4, and are extended so that the tips are located between the bare chips 3, 4 and the first inner leads 22. Therefore, wire bonding connection can be performed at the one side of the bare chips 3 and 4, thereby allowing the bonding wires 25 and 27 to be shorter. Moreover, in the second embodiment, since the height of the bonding wires are restrained lower so that the bonding wires do not contact the bare chips as in the first embodiment, thereby preventing the short-circuit failure.

Figure 14:
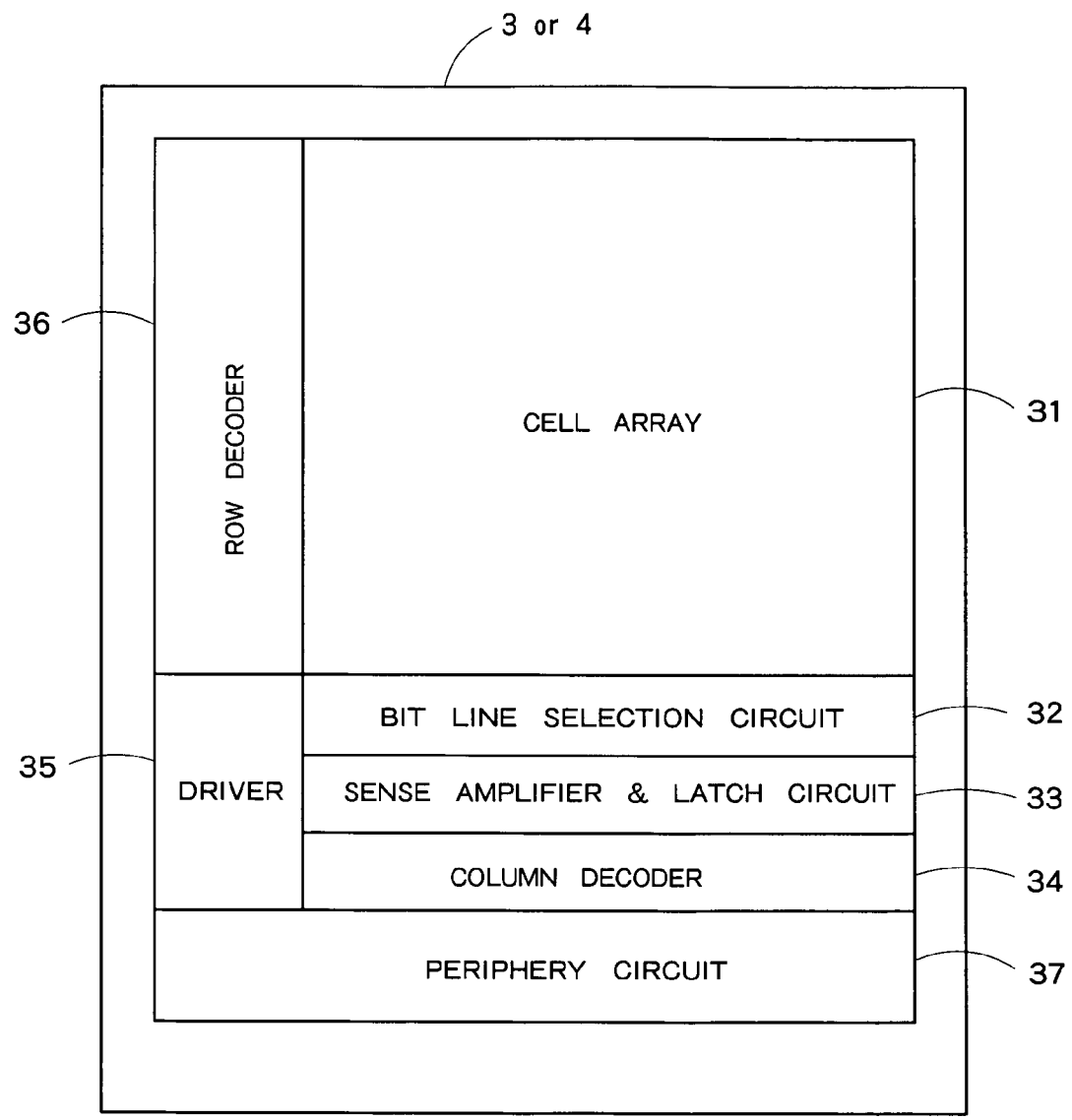
FIG. 14 is a layout view shows internal configuration in the bare chips of the flash memory.

FIG. 14 shows a specific example of the semiconductor chip shown in FIG. 11. Here, as an example of a semiconductor chip in which NAND flash memories with configuration having pads on single side are monolithically integrated, an example of its layout will be described.

The bare chip 3 in FIG. 14 has a cell array 31, a bit line selection circuit 32, a sense amplifier and a latch circuit 33, a column decoder 34, a driver 35, a row decoder 36, and a periphery circuit 37.

The cell array 31 has a plurality of memory cells arranged in a matrix, a plurality of word lines and selective gate lines arranged in the row direction, a plurality of bit lines arranged in the column direction, and a shield power supply (not shown) for supplying an electronic potential that shields between odd numbered bit lines and between even numbered bit lines.

The bit line selection circuit 32, the sense amplifier and the latch circuit 33, and the column decoder 34 are arranged in order in the column direction with respect to the cell arrays 31. The row decoder 36 is arranged in the row direction with respect to the cell arrays 31, and the driver 35 is arranged in the column direction with respect to the row decoder 36.

In this manner, since the drivers 35 for driving the bit line selection circuit 32 are gathered in one place, integration degree can be increased, thereby reducing the circuit scale.

The sense amplifier 33 amplifies the data read out from the memory cell via the bit line. When odd numbered bit line electric potential is supplied to the sense amplifier, the bit line selection circuit 32 sets even numbered bit line electric potential to the shield power supply potential, and when even numbered bit line electric potential is supplied to the sense amplifier 33, the bit line selection circuit 32 sets odd numbered bit line electric potential to the shield power supply.

In this manner, the bit line selection circuit 32 has both of a function for selecting the bit line to connect it to the sense amplifier 33, and a function for connecting the non-selected bit lines to the shield power supply. Therefore, as compared to the case where circuits having these functions are arranged by dividing them into two, integration degree is increased, thereby reducing circuit volume.

In the above mentioned embodiments, examples in which the bare chips for the flash memory are stacked, have been described. However, the present invention are applicable to various kinds of semiconductor devices mounted on a bed frame or an inner lead. The bare chips to be stacked are not necessarily required to have the same type of configuration. For example, memories and controllers or the like may be stacked.

In addition, in the first embodiment, bare chips are stacked on top and bottom surfaces of the bed frame 1. However, the bare chips may be stacked only on one surface.

What is claimed is:

1. A semiconductor device, comprising:
    a plurality of bare chips stacked on at least one of first and second main surfaces oppositely arranged on a bed frame;
    spacers arranged between two bare chips arranged adjacently in up and down direction among the plurality of bare chips;
    inner leads which are arranged at both sides in a horizontal direction of the bed frame and are connected to pads of the bare chips via bonding wires; and
    a molding member which seals the bed frame, the plurality of bare chips, the spacers, the inner leads and the bonding wires, wherein
    a sum of a thickness of a binding material which bonds the spacer to the bare chip at one end side of the spacer and a thickness of the spacer is two to four times the diameter of the bonding wires.

2. The semiconductor device according to claim 1, wherein the binding material is formed on the entire surface of the bare chip.

3. The semiconductor device according to claim 1, wherein the binding material is formed only on places contacted by the spacers.

4. The semiconductor device according to claim 1,
    wherein a plurality of the bare chips are stacked on the first and second main surfaces, respectively;
    the bonding wires are connected on a top surface and a bottom surface of the inner leads; and
    connection locations of the bonding wires on the inner leads at the top surface of the inner leads are displaced in a horizontal direction from connection locations of the bonding wires on the inner leads at the bottom surface of the inner leads.

5. The semiconductor device according to claim 1,
    wherein the spacers are silicon spacers; and
    the bare chips include flash memory chips.

6. A semiconductor device, comprising:
    first inner leads;
    second inner leads which are arranged separately from the first inner leads in a horizontal direction and have lead parts longer than those of the first inner leads;
    a plurality of bare chips which are stacked across a spacer on the second inner leads and have pads formed along one side, the plurality of bare chips being arranged with ends spaced from end portions at first inner leads of the lead parts; and
    a plurality of bonding wires which connect the first inner leads to pads of the plurality of bare chips and the second inner leads to pads of the plurality of bare chips, wherein
    a sum of a thickness of a binding material which bonds the spacer to the bare chip at one end side of the spacer and a thickness of the spacer is two to four times the diameter of the bonding wires.

7. The semiconductor device according to claim 6,
    wherein the binding material is formed on the entire surface of the bare chip.

8. The semiconductor device according to claim 6,
    wherein the binding material is formed only on places contacted by the spacers.

9. The semiconductor device according to claim 6,
    wherein the spacers are silicon spacers; and
    the bare chips include flash memory chips.

10. The semiconductor device according to claim 6, further comprising a molding member which seals the plurality of bare chips, the spacers, the first inner leads, the second inner leads and the bonding wires.

11. A method of manufacturing a semiconductor device, comprising:
    mounting a first bare chip on a first main surface of a bed frame via a binding material;
    attaching a first spacer on a surface of the first bare chip via the binding material;
    connecting the pads of the first bare chip and inner leads by bonding wires and arranging the bonding wires so that a maximum height of the bonding wires become lower than a top end of the first spacers;
    attaching a second bare chip on a surface of the first spacer via the binding material;
    connecting pads of the second bare chip and the inner leads by the bonding wires;
    attaching a third bare chip on a second main surface of the bed frame via the binding material in parallel to one of the processings of mounting the first bare chip, attaching the first spacer, connecting the pads, attaching the second bare chip and connecting the pads, or after all the processings are finished;
    attaching a third spacer on a surface of the third bare chip via the binding material;
    connecting pads of the third bare chip and the inner leads by the bonding wires and arranging the bonding wires so that a maximum height of the bonding wires becomes lower than a top end of the third spacer;
    attaching a fourth bare chip on a surface of the third spacer via the binding material;

connecting pads of the fourth bare chip and the inner leads by the bonding wires; and a molding member which seals the bed frame, the plurality of bare chips, the spacers, the inner leads and the bonding wires, wherein a sum of a thickness of a binding material which bonds the spacer to the bare chip at one end side of the spacer and a thickness of the spacer is two to four times the diameter of the bonding wires.

12. The method of manufacturing the semiconductor device according to claim 11, wherein the binding material is formed on the entire surface of the bare chip.

13. The method of manufacturing the semiconductor device according to claim 11, wherein the binding material is formed only on places contacted by the spacers.

14. The method of manufacturing the semiconductor device according to claim 11, wherein a plurality of the bare chips arc stacked on the first and second main surfaces, respectively;

the bonding wires are connected on a top surface and a bottom surface of the inner leads; and connection locations of the bonding wires on the inner leads at the top surface of the inner leads are displaced in a horizontal direction from connection locations of the bonding wires on the inner leads at the bottom surface of the inner leads.

15. The method of manufacturing the semiconductor device according to claim 11, wherein the spacers include silicon spacers; and the bare chips are flash memory chips.

16. The semiconductor device according to claim 1, wherein the bonding wires which connect the pads of the bare chips at one end side of the spacers to the corresponding inner leads, are arranged not to contact the bare chip at the other end side of the same spacer.

17. The semiconductor device according to claim 5, wherein the bonding wires which connect the pads of the bare chips at one end side of the spacers to the corresponding inner leads, are arranged not to contact the bare chip at the other end side of the same spacer.

18. The semiconductor device according to claim 6, wherein the bonding wires which connect the pads of the bare chips at one end side of the spacers to the corresponding first or second inner leads are arranged not to contact the bare chip at the other end side of the same spacer.

19. The semiconductor device according to claim 9, wherein the bonding wires which connect the pads of the bare chips at one end side of the spacers to the corresponding first or second inner leads are arranged not to contact the bare chip at the other end side of the same spacer.

* * * * *